United States Patent [19]

Sprout

[11] Patent Number: 4,675,959
[45] Date of Patent: Jun. 30, 1987

[54] PRODUCTION OF PIEZOELECTRIC DIELECTRIC FILMS BY POLING IN STACK FORM

[75] Inventor: Oliver S. Sprout, Glenside, Pa.

[73] Assignee: Pennwalt Corporation, Philadelphia, Pa.

[21] Appl. No.: 735,025

[22] Filed: May 17, 1985

Related U.S. Application Data

[63] Continuation of Ser. No. 248,151, Mar. 30, 1981, abandoned, which is a continuation-in-part of Ser. No. 200,237, Oct. 24, 1980, abandoned, which is a continuation-in-part of Ser. No. 726,380, Sep. 24, 1976, abandoned.

[51] Int. Cl.$^4$ ............................................. H01L 41/22
[52] U.S. Cl. .................................... 29/25.35; 264/22; 310/800; 361/225; 361/233

[58] Field of Search .............. 29/25.35, 592 E, 592 R; 264/22; 310/800; 361/225, 233; 307/88 ET; 179/111 E

[56] References Cited

U.S. PATENT DOCUMENTS 3,316,620  5/1967  Stewart, Jr. ........................ 29/592 E
3,943,614  3/1976  Yoshikawa et al. ................ 29/25.35

Primary Examiner—Carl E. Hall

[57] ABSTRACT

A multi-layer stack of dielectric films containing at least one piezoelectric-sensitive (PES) film is subjected to a high dc field strength while the stack is maintained at an elevated temperature to induce piezoelectric properties in the PES films. Various stacking arrangements of the films in the multi-layer can be used to obtain enhanced piezoelectric properties for various PES films in the multi-layer stack.

14 Claims, No Drawings

PRODUCTION OF PIEZOELECTRIC DIELECTRIC FILMS BY POLING IN STACK FORM

CROSS-REFERENCE TO RELATED APPLICATION

This is a continuation of co-pending application Ser. No. 248,151, filed on Mar. 30, 1981 now abandoned, which is a continuation-in-part of U.S. Ser. No. 200,237 filed on Oct. 24, 1980, now abandoned, which is a continuation-in-part of U.S. Ser. No. 726,380 filed Sept. 24, 1976, now abandoned.

BACKGROUND OF THE INVENTION

This invention relates to a process for treating a stack of dielectric film to render piezoelectric-sensitive (PES) film in such stack piezoelectric, and more particularly, to a high dc field intensity technique for the production of piezoelectric film which technique minimizes catastrophic breakdown of the film during processing.

Films of dielectric materials have been observed to be capable of acquiring a static electric charge upon being poled (i.e., being exposed to a dc field) which static charge is quasi-permanent, the degree of permanency being dependent largely upon the chemical constitution of the film. Such a charge, due largely to trapped positive and negative carriers positioned at or near the two surfaces of the dielectric respectively, produces what is known as an electret. When the opposing surfaces of an electret are not covered by metal electrodes, the structure possesses an electrostatic field and is, in a sense, the electrostatic analogue of the permanent magnet.

In addition to being capable of acquiring a static electric charge (and, as a result acquiring an electrostatic field), a certain limited class of film also acquires an ordered internal molecular orientation when exposed to a dc field so that even when the static (or electret characterizing) charges are dissipated, the film thereafter possesses the property of being able to generate an electric current between the electrically connected opposed surfaces by changing the pressure imposed on the opposed surfaces. This property is known as the piezoelectric effect and some such film (e.g., film made from polyvinylidene fluoride (PVDF)) also possesses a pyroelectric effect (i.e., the property of producing electron flow by changing the temperature of the film). Also, when a voltage is applied to the opposite surfaces of a piezoelectric film, a reverse piezoelectric effect occurs, i.e., the film deforms in proportion to the voltage applied to it.

Unfortunately, the term "electret" has been broadly used in the art to indicate any film that has been poled whether or not there has been molecular orientation; obviously such broad application of the term is misleading. The confusion is compounded by the fact that piezo- and pyroelectric films are capable, during exposure to a dc field, of acquiring static "electret-type" charges along with the internal molecular orientation. The present invention is directed to the production of a piezoelectric film which may also be pyroelectric.

PROBLEMS IN POLING

Thin polymeric films (i.e., those having a thickness of less than about 150 micrometers, "$\mu$m") having relatively high dielectric constants are particularly useful for the production of piezoelectric film because of the relative ease (when compared with thicker films) with which they acquire the desired property. Unfortunately, thin films, when exposed to a high strength dc field (i.e., at least about 200 kilovolts per centimeter of film thickness) individually, i.e., using a single layer of film between opposing electrodes, are more subject to breakdown in the electrical field than thick films. Furthermore, minor film defects, such as thickness variation or the presence of impurities or small holes are more apt in thin as opposed to thick film to promote film breakdown under the conditions of high temperature and high voltage. When breakdown of the film occurs, the electrical field cannot be maintained because a short circuit results across the electrodes. The problem is particularly acute in the poling of film formed from PVDF, a type of film particularly susceptible to acquiring the piezoelectric effect, because this film decomposes to produce hydrofluoric acid which tends to further deteriorate the film by chemical action and to produce a residue of conductive carbon which creates a path for short circuiting. Furthermore, because severe field conditions generally are required for production of piezoelectric film, the film-breakdown problem occasioned during thin film exposure is particularly troublesome in producing piezoelectric film.

STATEMENT OF THE INVENTION

The present invention provides a process for producing thin piezoelectric film from PES film. By piezoelectric-sensitive film "PES film" is meant a dielectric film that is capable of acquiring a piezoelectric activity of at least 5 pico-Coulombs per Newton (pC/N) when subjected to a high strength dc field. The process comprises applying, to a multi-layer stack of thin dielectric film, at least one of which is a PES film, at a temperature between room temperature and a temperature just below the melting point of the film, a high strength dc field, the multi-layer being disposed between a single set of oppositely charged electrodes with the outer layers of the multi-layer in contact with the electrodes, and maintaining the field until piezoelectric activity is induced in at least one of the PES films, and thereafter cooling the multi-layer to below about 50° C. before or after removing the dc field, removing the dc field and thereafter grounding the PES film to remove surface charge.

The multi-layer stack of this invention is composed of at least two layers of dielectric film whose surfaces are in abutting relationship. Preferably each film in the stack should be of the same size, with the edges of each film being in alignment with one another. If the layers in the stack are different sizes, however, it is essential that at least a portion of the layers overlap and that the overlapping portions occupy the area between the electrodes even though their borders are not aligned. It is desirable to have the film cut into layers larger than the electrodes in order to prevent edge arcing (i.e., an electrical discharge that runs along the edge of the film and jumps across the film at the edge to the other electrode).

DESCRIPTION OF THE PREFERRED EMBODIMENTS

PES films to which the process of the present invention is applicable are those formed from high molecular weight vinylidene fluoride polymers, vinylfluoride polymers, vinylchloride polymers and polyamides. Such polymers may be homopolymers, copolymers, or terpolymers, as well as polymer mixtures or blends. Preferred polymers are those containing at least a major mol proportion of vinylidene fluoride including, for example, vinylidene fluoride homopolymers, and co-polymers or terpolymers containing at least 65 mol percent of vinylidene fluoride and at least one other copolymerizable monomer such as trifluoroethylene, tetrafluoroethylene or vinyl fluoride. Particularly good results are obtained using vinylidene fluoride homopolymer or a copolymer of about 65 to 75 weight percent vinylidene fluoride and about 35 to 25 weight percent tetrafluoroethylene.

It is preferred that the PES films, used in the present process be monoaxially oriented or multiaxially oriented by conventional means such as blowing, stretching, rolling, or any combination of these techniques since oriented film has enhanced susceptibility to acquisition of the piezoelectric property compared with un-oriented film.

While the process of the present invention is applicable to the treatment of PES film of any thickness, it is particularly applicable when treating thin PES film, i.e., such film having a thickness below about 150 micrometers ($\mu m$), because the piezoelectric property is imposed more readily upon a thin film. When exposing film in a stack to a dc field, as required by the process of the present invention, each film may be of the same or a different thickness.

Metallizing the surfaces of film that contact electrodes to provide the film with a conductive coating ensures excellent contact and distributes the dc field uniformly over the surfaces of the film in the stack. Such metallizing also aids the rapid grounding of the multi-layer to remove the surface charge after exposure to the dc field. Suitable conductive coatings may be formed, for example, by vapor deposition, painting, electroplating, sputtering, laminating and the like (called metallizing) of various conductive materials including, for example, metals or metallic oxides, as are well known in the art.

While other film surfaces within the stack may also have a conductive coating imposed thereon (provided there are at least two adjacent layers without any such conductive coating on their abutting surfaces), the use of such coatings is not a preferred embodiment since it defeats the purpose of the present invention. Since a metallized coating acts as an electrode, providing a coating on the surface of the second film in a three-layer stack, which surface abuts the third layer of said stack, would, for example, effectively serve to reduce the three-layer stack to a two-layer stack.

The optimum elevated temperature at which the multi-layer of dielectric films is maintained during exposure to the dc field will vary depending on the nature of the resins. Generally any temperature from about room temperature (i.e., about 20° C.) to just below the melting point of the film, is useful. Best results are obtained at a temperature near, but below the melting point of the film which generally is between about 50° and about 120° C. Usually a temperature between the range of about 80° and about 110° C. is preferred.

The stacking arrangements of various PES films in a multi-layer stack has been found to provide particular effectiveness in inhibiting film breakdown and in enhancing the introduction of piezoelectric activity. For instance, a multi-layer with a thin PES film (e.g., a film constituting from about 9 to about 35% of the total stack thickness) as the layer of the stack adjacent the positive electrode, especially in conjunction with substantially thicker adjacent layers, has been found to be more effective in inhibiting film breakdown in the PES film than where such a thin film is disposed in any other position in the stack.

Similarly where the stack is composed of uniaxially and/or biaxially oriented poly(vinylidene fluoride) homo- and/or co-polymers prepared by suspension or emulsion polymerization, the type of orientation as well as the polymerization process (i.e., suspension or emulsion) by which the polymer was formed will influence the tendency of layers of the stack to break down. Thus a uniaxially or biaxially oriented film prepared by suspension polymerization as a component of the stack can best be protected against breakdown by having it positioned adjacent to at least one other film prepared by emulsion polymerization which other film is unoriented provided, however, that in the case in which a uniaxially oriented film prepared by suspension polymerization is to be protected, the other film may be prepared by emulsion or suspension polymerization and be biaxially oriented. Similarly an uniaxially or biaxially oriented film prepared by emulsion polymerization as a component of the stack, can best be protected against breakdown by positioning it adjacent to at least one other emulsion polymerization film having the same orientation.

In one embodiment of the process of the present invention, the multi-layer array of PES film, between and in contact with a pair of electrodes, is placed in a hot oven and a direct current voltage field is applied across the electrodes to expose the stack at a field strength intensity of from at least about 50 kilovolts to about 1500 kilovolts per centimeter (kv/cm); the preferred field intensity range across the desired film being exposed is from about 200 to about 1500 kv/cm; usually from about 300 to about 1000 kv/cm is used.

While exposing to the dc field for about one hour is usually sufficient to induce piezoelectric activity in the PES film of the stack, periods within the range of about 30 minutes to about 24 hours may be used as desired, depending on the chemical and physical properties of the various films and other exposure to the dc field conditions, (e.g., the higher the dc field intensity, the shorter the needed exposure time). In raising the voltage of the standing field to the desired high level of intensity, it is preferred to increase gradually the voltage until the desired field strength intensity is reached. The exposed PES films have a piezoelectric activity of at least 5 pC/N, and preferably of at least 10 pC/N.

EXAMPLES

The following examples will serve to further illustrate this invention.

Unless otherwise indicated, the standard exposing to dc field intensity procedure used in the examples was as follows:

A multi-layer of PES film samples was placed between and in contact with two brass electrode discs (0.6 cm thick by 6.35 cm in diameter); the multi-layer-electrode assembly was then placed in a hot oven (80° to 110° C.) for about 5 to 15 minutes to warm up before electrical power was applied; a direct current (dc) field was then applied across the electrodes stepwise in increments of about 100 kv/cm with about one minute intervals between increments up to 500 kv/cm of film stack thickness. This application of dc voltage (at 500 kv/cm) was continued for about one hour. While the dc field intensity was maintained, the heat in the oven was turned off and the multi-layer was cooled to below about 50° C.

Table A sets forth an identification of the various PES films used in the examples.

TABLE A

| | PES FILM IDENTITY | | |
|---|---|---|---|
| FILM NO. | DESCRIPTION | ORIENTATION | SUSPENSION (S) OR EMULSION (E) |
| I. | Copolymer of 70 wt. % vinylidene fluoride (VDF) & 30 wt. % of tetrafluoro-ethylene (TFE) | unoriented | E |
| II. | Copolymer of 70 wt. % VDF & 30 wt. % TFE | uniaxial | E |
| III. | PVDF | uniaxial | S |
| IV. | PVDF | biaxial | S |
| V. | PVDF | biaxial | E |

The piezoelectric strain coefficient ($d_{33}$) measurements were made by inserting a poled PES film sample between removable aluminum foil (25 μm thick) electrodes in contact with 0.6 cm brass electrodes of 6.35 cm. diameter. This assembly was put into a Carver press in such a way as to be insulated from the press platens. The homocharge was removed by short circuiting the film surfaces under pressure overnight. The $d_{33}$ constant values were obtained by applying 3600 kilograms (115 Kg/cm$^2$) to the specimen and recording the piezoelectric charge developed using a highly sensitive electrometer. The values were recorded in pico-Coulumbs per Newton (pC/N).

In the examples, the film in the A position is the layer of film in the multi-layer stack that is in contact with and adjacent to the positive electrode. The film in the B position is the layer of film in the stack that is in contact with and adjacent to the film in the A position. Additional layers of film in the stack, if any, are similarly indicated as being in the C, D, E, etc. positions.

EXAMPLE 1

A non-standard exposure to dc field procedure was used in this example with film I of TABLE A constituting the multi-layer of films. The following TABLE 1 shows the poling conditions and observations for films treated in accordance with this example.

TABLE 1

| No. of layers | Film Thickness, μm | | | Breakdown Conditions kv./cm. | Temp. °C. | Poling Conditions | | | | $d_{33}$ Constant pC/N |
|---|---|---|---|---|---|---|---|---|---|---|
| | A | B | Sum | | | Heating | | Cooling | | |
| | | | | | | Min. | kv./cm. | Min. | kv./cm. | |
| 1* | 20 | — | 20 | 202 | 80 | | | | | |
| 1 | 23 | — | 23 | 162 | 80 | | | | | |
| 2** | 24 | 20 | 44 | — | 83 | 60 | 342 | 45 | 228 | A + B/13.0*** |
| 2 | 20 | 25 | 45 | — | 84 | 60 | 450 | 45 | 338 | A/14.2**** B 7.8 |

*Samples were circles of 7 cm in diameter
**Samples were squares 8.9 × 8.9 cm.
***pC/N was measured on both films together
****pC/N was measured on A and B separately TABLE 1 shows that when a voltage was applied to a single film, the film brokedown at an electrical field strength of 202 and 162 kv/cm. On the other hand, when a voltage was applied to a multi-layer of two films under similar conditions, the multi-layer was exposed to dc field intensity without breakdown at much higher electrical field strengths for 60 minutes at elevated temperatures.

EXAMPLE 2

Films I and II of TABLE A were subjected to the standard exposure to dc field procedure in this example.

The effect of film thickness was investigated in these experiments. The results are set forth in the following TABLE 2.

TABLE 2

| No. of layers | Film Thickness, μm | | | | Type of Film | Poling Conditions | | Remarks |
|---|---|---|---|---|---|---|---|---|
| | A | B | C | Sum | | kv./cm. | Minutes | |
| 1 | 93 | — | — | 93 | Base Film | 500 | 5 | Breakdown occurred in 5 min. |
| 1 | 33 | — | — | 33 | Uniaxially Drawn Film From Base Film | 500 | 20 | Breakdown occurred in 20 min. |
| 3 | 23 | 30 | 29 | 82 | Stack of Uniaxially Drawn Film From Base Film | 500 | 60 | Film was cooled to <50° C. over thirty minutes and the surface charge was removed. The piezoelectric constant $d_{33}$ for film B was 13.8 pC/N and for Film C it was 8.6; film A tore during test- |

TABLE 2-continued

| | Film Thickness, μm | | | | | Poling Conditions | | |
|---|---|---|---|---|---|---|---|---|
| No. of layers | A | B | C | Sum | Type of Film | kv./cm. | Minutes | Remarks |
| | | | | | | | | ing and was not measured. |

The results reported in TABLE 2 show that when a voltage was applied to a single, undrawn or drawn film, having a respective thickness of 93 and 33 μm, the film brokedown under an electrical field strength of 500 kv/cm in 5 minutes for the undrawn film and 20 minutes for the drawn. However, when the same type of drawn film was arranged in a three-layer stack, this stack could be exposed to the electrical field. The thickness of the three-layer stack was essentially equivalent to that of the undrawn, single layer film. These results suggest that the multi-layer arrangement contributed to successful exposure.

EXAMPLE 3

Set number 1 of a multi-layer stack of films III and IV of Table A was prepared by first laying a 8.9 cm. square sample of film III in the film A position of a certain thickness on top of two layers of 8.9 cm. square film IV as films B and C. These layers were than placed between two 7.6 cm. square, 11 μm thick, aluminum foils. The stack was then sandwiched between two brass electrode discs having a thickness of 0.6 cm. and a diameter of 6.35 cm.

Set number 2 was prepared as in set number 1 except that the top aluminum foil and film A were replaced with a 7.6 cm. square, one face metallized, film III as film A with the metallized face up and in contact with the top electrode disc.

Set number 3 was prepared as in set number 2 except that the bottom film C and the bottom aluminum foil were replaced with a 7.6 cm. square, one face metallized, film III as film C with the metallized face down and in contact with the bottom electrode disc.

The total thickness of the films in each of the stacks, excluding the aluminum foil, was the basis for calculating field strength.

The stacks were exposed to the dc field, in accordance with the standard exposure procedure at 99±1° C. after which they were permitted to cool for 45±5 minutes to about 50° C. while the current was maintained.

This example indicated that the exposure of uniaxial, suspension film was better than biaxial, suspension film in a multi-layer stack regardless of where the uniaxial film was located. The results are set forth in the following TABLE 3.

TABLE 3

| | Film Type | | | Film Thickness, μm | | | | $d_{33}$ pC/N | | |
|---|---|---|---|---|---|---|---|---|---|---|
| Set No. | A | B | C | A | B | C | Sum | A | B | C |
| 1. | III | IV | IV | 16 | 23 | 22 | 61 | 27.0 | 8.0 | 5.3 |
| 2. | III | IV | IV | 20 | 26 | 25 | 71 | 20.2 | 14.3 | 4.2 |
| 3. | III | IV | III | 20 | 25 | 19 | 64 | 23.8 | 6.7 | 33.7 |
| 3. | III | IV | III | 20 | 27 | 18 | 65 | 15.2 | 5.1 | 32.0 |

EXAMPLE 4

Films III and IV of TABLE A were exposed to dc field by the standard procedure in multi-layer stacks consisting of three films III, three films IV, or one film III on two films IV. The piezoelectric activity values acquired by film A in the stacks of homogeneous films III and IV were relatively low: 11.8 pC/N for a stack of film III (4.1) and 16.0 pC/N for a stack of film IV (4.3). However, the piezo value for the film III exposed on top of two films IV was 21.9 pC/N (4.2); this is a substantial increase in piezo activity over the homogeneous stacks of films III and IV. See the following TABLE 4. The effect of the arrangement of one layer of film III on two layers of film IV was surprising, since the piezoelectric activity value attained was much greater than would have been anticipated from the activity values observed upon exposing homogeneous stacks of films III or IV.

TABLE 4

| | STACK | | μm | $d_{33}$ pC/N |
|---|---|---|---|---|
| NO. | UNIAXIAL | BIAXIAL | TOTAL | FILM A |
| 4.1 | A,B,C | — | 69 | 11.8 |
| 4.2 | A | B,C | 61 | 21.9 |
| 4.3 | — | A,B,C | 64 | 16.0 |

EXAMPLE 5

A series of film III of TABLE A was exposed to dc field on top of a multi-layer stack of film IV or V of TABLE A. The exposures and their results are summarized in TABLE 5.

When 3 layers of film III were exposed in a homogeneous, three-layer stack, the piezoelectric activity of film A was 10.1 pC/N (5.1). When one of these layers of film III was exposed on top of two layers of films IV, the piezo value of film A was 30.3 pC/N (5.3).

A specimen of film III poled on top of two layers of films V also acquired a piezo activity above the value for the homogeneous stack of film III.

Overall, improved effects were obtained by exposing uniaxial Type S films on biaxial films.

TABLE 5

| | FILM A | STACK | | | $d_{33}$ pC/N |
|---|---|---|---|---|---|
| NO. | μm | UNIAXIAL | BIAXIAL | TOTAL | FILM A |
| 5.1 | 15 | A,B,C | — | 41 | 10.1 |
| 5.2 | 15 | A | **B,C | 48 | 24.6 |
| 5.3 | 15 | A | *B,C | 53 | 30.3 |

*B & C are Film IV
** B & C are Film V

EXAMPLE 6

The protocol of Example 5 was repeated using films III and IV of TABLE A; film III was the top layer for each specimen.

Film III exposed to a dc field in a homogeneous three-layer stack possessed an activity value of 5.6 pC/N, the lowest in this series. Exposing film III on layers of film IV produced piezo values of 15.2, 18.5, and 22.8 pC/N.

When each layer of film IV had 5 μm thickness, the film A acquired piezoelectric activity value of 15.2 pC/N (6.2), well above the value from poling a homogeneous three-layer stack (6.1). When the six under-layers were used in 6.3, higher activity in film A was obtained. The best piezoelectric activity of film A was produced in a three-layer stack where a lower thickness ratio of film A to stack thickness was used. This suggests that the arrangement of layers in a multi-layer stack based on thickness is an important feature.

TABLE 6

| NO. | STACK UNIAXIAL* | BIAXIAL | μm TOTAL | $d_{33}$ pC/N FILM A |
|---|---|---|---|---|
| 6.1 | A,B,C | — | 24 | 5.6 |
| 6.2 | A | B, C, D | 23 | 15.2 |
| 6.3 | A | B thru G | 38 | 18.5 |
| 6.4 | A | B, C | 44 | 22.8 |

*Film III having an average thickness of 8 μm.

EXAMPLE 7

Film III of TABLE A was exposed to a dc field in the top or A position of three layer stacks by the standard exposure method. The pair of PVDF films comprising the under-layers were of three varieties:

a. Film IV of TABLE A,
b. Film III of TABLE A, and
c. Film V of TABLE A.

The characteristics of the stacks and results of exposing are summarized in TABLE 7.

In specimens 7.1, 7.2 and 7.3, each film in the multi-layer stack has substantially the same thickness. These three specimens show that when all other variables, e.g., thickness, are equal, a multi-layer composed of a film III on top of two layers of film IV produces the best piezoelectric activity (7.1). A homogeneous multi-layer of film III produced the worst activity of these three specimens (7.2). The differences in the activities of these specimens must have been due to the respective under-layers.

Specimens 7.4, 7.5 and 7.6 go one step further by substantially varying the thickness in the multi-stacks where the under-layers are film IV or film V. Film A in these specimens is much thinner than the film A in the first three specimens mentioned above. Specimen 7.6 shows the best results at an activity of 27.0, when film III is stacked on top of two layers of film V. This superior result can be attributed to the substantial increase in thickness of the under-layers over the top layer. The lowest piezoelectric activity value for film A resulted from exposing to a dc field a stack of homogeneous thin film (7.5). The combination of thin and thick films produced a reversal of the trend exhibited in specimens 7.1 and 7.3. It is surprising that the exposing of thin film III on top of a great thickness of film V resulted in such high activity in film III.

TABLE 7

| No. | FILMS B & C RESIN TYPE | FILM STACK THICKNESS, μm | | | | $d_{33}$ pC/N FILM A |
|---|---|---|---|---|---|---|
| | | A* | B | C | TOTAL | |
| 7.1 | IV | 18 | 20 | 18 | 56 | 21.9 |
| 7.2 | III | 18 | 18 | 18 | 54 | 10.1 |
| 7.3 | V | 18 | 18 | 18 | 54 | 14.3 |
| 7.4 | IV | 8 | 18 | 18 | 44 | 22.8 |
| 7.5 | III | 8 | 8 | 8 | 24 | 5.6 |

TABLE 7-continued

| No. | FILMS B & C RESIN TYPE | FILM STACK THICKNESS, μm | | | | $d_{33}$ pC/N FILM A |
|---|---|---|---|---|---|---|
| | | A* | B | C | TOTAL | |
| 7.6 | V | 8 | 41 | 41 | 90 | 27.0 |

*Film III

EXAMPLE 8

Various thicknesses of Film IV of TABLE A were exposed to a dc field by two procedures:

a. Standard exposure method was used in which the under-layers were the 23 μm film IV of TABLE A.
b. Exposing to a dc field under increased pressure was used which employed two under-layers of thick film I of TABLE A, each about 81 μm thick. This exposure was conducted in a hydraulic press fitted with platens which could be heated and cooled. The stack of 8.9 cm. square films was inserted between 6.35 cm. diameter brass electrodes; this assembly was then subjected to a total force of 770 kg. (equivalent to 24 kg/cm² on the films) to minimize film wrinkling which may sometimes otherwise occur during exposure. The films were exposed to a dc field for 30 mins. at 110° C., followed by cooling for 20 mins. under the applied field of 210 kV/cm.

The piezoelectric activities of the film A of the multi-layer stacks exposed by the two methods are set forth in TABLE 8. Exposing the film IV on layers of thick film I led to a higher piezoelectric activity value for the film IV, than exposing film IV in a homogeneous multi-layer stack wherein each layer was substantially the same thickness; this indicates a favorable effect from exposing a stack containing large thickness ratios of film I to film IV. Additional advantages with respect to poling conditions (i.e., time, temperature, field strength, etc.) also accrue.

TABLE 8

| NO. | FILMS B & C RESIN TYPE | FILM THICKNESS (μm) | | | $d_{33}$ pC/N FILM A |
|---|---|---|---|---|---|
| | | A* | B | C | |
| 8.1 | IV | 16 | 23 | 23 | 11.8 |
| 8.2 | I | 16 | 81 | 81 | 20.7 |

*Film IV

EXAMPLE 9

The films exposed to a dc field in this example were the same as employed in Examples 5 and 6, but in reverse order. The data shown in TABLE 9 is based on a stacking order of a film IV on top of two layers of film III. The standard exposure method was used.

In TABLE 9 the results demonstrated that when film IV is exposed on top of two layers of film III (the reverse of the preferred arrangement), film IV adjacent the positive electrode acquired only low piezoelectric activity. Film III layers acquired the best activities in each specimen even though the film III layers were adjacent to the negative electrode. This suggests that regardless of where film III is located in the stack, it always produces the best activity. In this example, the piezoelectric activities are significantly below the activity range of 20 to 30 pC/N attained in comparable exposure of film III on layers of film IV (e.g., Examples 5 and 7).

TABLE 9

| NO. | FILM IV FILM A μm | FILM III FILM III B & C μm AVE. | TOTAL TOTAL STACK μm | $d_{33}$ pC/N A | B | C | ENTIRE STACK |
|---|---|---|---|---|---|---|---|
| 9.1 | 15 | 16 | 47 | 5.3 | 4.2 | 9.3 | 5.0 |
| 9.2 | 23 | 22 | 67 | 11.8 | 15.2 | 19.4 | 13.8 |

EXAMPLE 10

Film V of TABLE A was exposed to a dc field as the top layer in a multi-layer stack where the bottom layers were film IV of TABLE A. The results in TABLE 10 demonstrate that film V attains higher piezoelectric activity values when exposed on layers of film V than when exposed on layers of film IV.

TABLE 10

| | | μm THICKNESS | | |
|---|---|---|---|---|
| NO. | FILMS B & C | FILM A FILM V | TOTAL STACK[1] | $d_{33}$ pC/N FILM A |
| 10.1 | Film IV | 23 | 72 | 6.2 |
| 10.2 | Film IV | 21 | 73 | 4.7 |
| 10.3 | Film V | 22 | 66 | 13.8 |
| 10.4 | Film V | 22 | 66 | 14.7 |

[1] The Exposed Stack was only cooled for 10 minutes to about 80° C.

EXAMPLE 11

Three specimens of film V of TABLE A were exposed to a dc field in three-layer, homogeneous stacks as shown in TABLE 11 (11.1, 11.4 and 11.5). The piezoelectric activity of film A in the respective stacks ranged from 15.2 to 21.1 pC/N (11.1 and 11.4). Reduced activity resulted from lowering the field strength to 400 kV/cm (11.5). Exposing a homogeneous stack of five films produced a slightly lower piezo value of 13.5 (11.2).

When one layer of film V was exposed upon two layers of film IV, the resulting piezoelectric values of the top films were quite low, 3.6 and 7.3 pC/N, much less than corresponding films exposed in homogeneous stacks.

This example demonstrates that when film V is exposed in a homogeneous stack, the A film produces better activities than when film V is exposed on top of layers of film IV.

TABLE 11

| NO. | FILM A μm | STACK FILM V | FILM IV | μm TOTAL | $d_{33}$ pC/N FILM A |
|---|---|---|---|---|---|
| 11.1 | 15 | A,B,C | — | 51 | 21.1 |
| 11.2 | 15 | A thru E | — | 64 | 13.5 |
| 11.3 | 15 | A | B,C | 56 | 7.3 |
| 11.4 | 36 | A,B,C | — | 114 | 15.2 |
| 11.5* | 36 | A,B,C | — | 102 | 12.6 |
| 11.6 | 36 | A | B,C | 79 | 3.6 |

*poled at 400 KV/cm

EXAMPLE 12

The films exposed to a dc field in this example included film II of TABLE A. Exposures are summarized in TABLE 12. Stacks which contained three, four or five identical layers of film produced A film layers which had piezoelectric activity values of 27 to 28.7 pC/N (12.1, 12.3, 12.4). When film II was exposed on IV, values were very low, 2.8 and 3.4 pC/N (12.5, 12.2). This result was the opposite of that obtained when film III was exposed upon layers of film IV (Examples 5 and 6). However, the result was in accord with that obtained when film V was exposed upon layers of film IV (Example 11).

Low piezoelectric activities also resulted when film II was exposed as the bottom film in a three-layer stack with film IV (12.6). This indicates that the combination of film II and film IV was of no benefit to the activity of film IV regardless of the order of the films in the stack.

It may be concluded from the results of this example that when film II is exposed in a homogeneous stack under the standard exposure procedure, the A film produces better activities than when film II is exposed on top of layers of film IV.

TABLE 12

| NO. | STACK FILM II | FILM IV | μm TOTAL | $d_{33}$ pC/N FILM A |
|---|---|---|---|---|
| 12.1 | A thru E | — | 76 | 28.7 |
| 12.2 | A | B,C | 69 | 3.4 |
| 12.3 | A,B,C | — | 56 | 27.0 |
| 12.4 | A thru D | — | 76 | 27.0 |
| 12.5 | A | B,C | 66 | 2.8 |
| 12.6 | C | A,B | 69 | A = 14.3 |
| | | | | C = 5.6 |

What is claimed:

1. A process for treating thin PES film to impart piezoelectric activity thereto comprising applying, to a multi-layer of dielectric film at least one layer of which is thin PES film selected from homopolymers, copolymers terpolymers, or mixtures or blends of vinylidene fluoride polymers, vinylfluoride polymers, vinylchloride polymers, and polyamides at a temperature between about room temperature and a temperature just below the melting point of the film, a high strength dc field, said multi-layer being disposed between a single set of oppositely charged electrodes with the outer layers in contact with the opposite electrodes until piezoelectric activity is induced to the extent of at least 5 pC/N in at least one of the PES films, thereafter cooling the PES film to below about 50° C. before or after removing the dc field, removing the dc field and thereafter grounding the PES film to remove surface charge.

2. The process of claim 1 wherein at least one PES film has a thickness below about 150 μm.

3. The process of claim 1 wherein the layer of PES film adjacent the positive electrode is substantially thinner than the adjacent layers.

4. The process of claim 1 wherein at least one PES film is formed from a high molecular weight vinylidene fluoride polymer.

5. The process of claim 4 where the high molecular weight vinylidene fluoride polymer is a homopolymer.

6. The process of claim 4 where the high molecular weight vinylidene fluoride polymer is a co-polymer of from about 65 to about 75 weight percent of vinylidene fluoride and from about 35 to about 25 weight percent of tetrafluoroethylene.

7. The process of claim 1 wherein at least one PES film is oriented.

8. The process of claim 7 wherein the oriented PES film is uniaxially oriented.

9. The process of claim 1 wherein the multi-layer to which the high strength dc field is applied is at a temperature in the range of from about 80° to about 110° C.

10. The process of claim 1 wherein the high strength dc field applied across the electrodes is from about 300 to about 1000 kilovolts per centimeter of thickness of the multi-layer.

11. The process of claim 10 wherein the field applied across the electrodes is gradually increased until the desired field strength is reached.

12. A process for treating thin PES film to impart piezoelectric activity thereto comprising applying, to a multi-layer of film at least one layer of which is thin PES film at a temperature between about room temperature and a temperature just below the melting point of the film, a high strength dc field, said multi-layer being comprised of a biaxially oriented film, prepared by suspension polymerization, positioned adjacent to at least one unoriented film, prepared by emulsion polymerization and being disposed between a single set of oppositely charged electrodes with the outer layers in contact with the opposite electrodes until piezoelectric activity is induced to at least one of the PES films, thereafter cooling the PES film to below about 50° C. before or after removing the dc field, removing the dc field and thereafter grounding the PES film to remove surface charge.

13. A process for treating thin PES film to impart piezoelectric activity thereto comprising applying, to a multi-layer of film at least one layer of which is thin PES film at a temperature between about room temperature and a temperature just below the melting point of the film, a high strength dc field, said multi-layer being comprised of an uniaxially oriented film, prepared by suspension polymerization, positioned adjacent to at least one biaxially oriented film, prepared by emulsion or suspension polymerization and being disposed between a single set of oppositely charged electrodes with the outer layers in contact with the opposite electrodes until piezoelectric activity is induced in at least one of the PES films, thereafter cooling the PES film to below about 50° C. before or after removing the dc field, removing the dc field and thereafter grounding the PES film to remove surface charge.

14. A process for treating thin PES film to impart piezoelecrric activity thereto comprising applying, to a multi-layer of film at least one layer of which is thin PES film at a temperature between about room temperature and a temperature just below the melting point of the film, a high strength dc field, said multi-layer being comprised of an uniaxially or biaxially oriented film, prepared by emulsion polymerization, positioned adjacent to at least one other emulsion polymerized film having the same orientation and being disposed between a single set of oppositely charged electrodes with the outer layers in contact with the opposite electrodes until piezoelectric activity is induced in at least one of the PES films, thereafter cooling the PES film to below about 50° C. before or after removing the dc field, removing the dc field and thereafter grounding the PES film to remove surface charge.

* * * * *